United States Patent
Lee

(10) Patent No.: US 6,906,373 B2
(45) Date of Patent: Jun. 14, 2005

(54) POWER DIVIDER

(75) Inventor: Jin Hyuk Lee, Taejeon-kwangyokshi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/317,168

(22) Filed: Dec. 12, 2002

(65) Prior Publication Data

US 2003/0111706 A1 Jun. 19, 2003

(30) Foreign Application Priority Data

Dec. 12, 2001 (KR) ........................... P2001-78569

(51) Int. Cl.$^7$ ............................................. H01L 27/108
(52) U.S. Cl. .................... 257/303; 257/304; 257/305; 257/307
(58) Field of Search ................. 257/303–310, 257/507; 438/257–262

(56) References Cited

U.S. PATENT DOCUMENTS

| 5,126,279 | A | * | 6/1992 | Roberts ..................... 438/210 |
| 5,658,821 | A | | 8/1997 | Chen et al. |
| 5,682,060 | A | | 10/1997 | Tung et al. |
| 6,638,816 | B2 | * | 10/2003 | Wakabayashi ............... 438/251 |
| 2002/0135009 | A1 | * | 9/2002 | Ohnishi et al. ............. 257/303 |
| 2003/0231061 | A1 | * | 12/2003 | Lautzenhiser et al. ....... 330/295 |

* cited by examiner

*Primary Examiner*—Hoai Pham
*Assistant Examiner*—Nathan W. Ha
(74) *Attorney, Agent, or Firm*—Birch, Stewart, Kolasch & Birch, LLP

(57) ABSTRACT

A power divider having metal capacitors is disclosed to detect and divide a frequency signal. The divide includes a first capacitor including first and second electrodes formed at a first portion of a substrate, a second capacitor including first and second electrodes formed at a second portion of the substrate, a first metal line connected to the second electrode of the first capacitor, a second metal line connected to the second electrode of the second capacitor, a poly resistor connected to a contact area of the first capacitor and to a contact area of the second capacitor, and a third metal line connected to the first and second metal lines to divide a signal flown through the first and second metal lines.

12 Claims, 5 Drawing Sheets

POWER DIVIDER

RELATED APPLICATION

This application claims the benefit of the Korean Patent Application No. P2001-78569 filed on Dec. 12, 2001, under 35 U.S.C. §119, which is hereby incorporated by reference.

BACKGROUND OF THE INVENTION

1. Field of the Invention

The present invention relates to a radio frequency (RF) power divider of a high output amplifier usable in an ultra high frequency band of a wireless transmitter, and more particularly, to a Wilkilson power divider detecting an AC signal by a metal capacitor, thereby minimizing depletion and stabilizing transmission of signals.

2. Discussion of the Related Art

Recently, in view of the increased diversity and high quality of wireless call services, the importance of maintenance and repair in the market of wireless call services has been recognized. As a demand for the wireless call service is on the increase, the required number of wireless call transmitters for transmitting signals by air path has increased. If various signals are simultaneously transmitted and such signals transmitted by the wireless call transmitter reach certain wide regions, it is possible for service providers to meet the increased demand for the wireless services with the existing personnel and equipment using a high output amplifier that can transmit signals to the wide regions.

However, a related art amplifier amplifying wireless signals has the limitation of a low output power level. To overcome this limitation, a plurality of low or medium output amplifiers connected in parallel are used to obtain the desired high power output.

A device for dividing and/or combining the wireless signals is called a power divider or a power combiner. A power divider is an interdependent device calculating a vector sum total of at least two signals.

RF power dividers can be classified into three categories: T-junction power divider, Wilkilson power divider, and Quadratue hybrid power divider. Among them, a particular power divider is selected according to desired characteristics.

A binary power divider is classified, in frequency of a microwave region, into a micro strip or strip line Wilkilson power divider.

The Wilkilson power divider is formed by connecting cascaded $\lambda/4$ converters in series. The cascaded $\lambda/4$ converters convert the impedance of an input signal to a parallel structure of a multi-output. An input voltage standing wave ratio (VSWR) of the power divider varies depending on the quality of the impedance converter and the VSWR of load terminating the output of the device.

A simple Wilkilson power divider is useful for a region using a limited bandwidth. But, if it is desired to increase the bandwidth of the power divider, it is required to additionally provide a $\lambda/4$ converter and an isolation resistor. That is, to increase the bandwidth, a plurality of converters have to be provided. But this increases the size of the power divider and energy loss due to resistance.

Meanwhile, a "coupling" refers to a state when an energy is interchanged between adjacent objects. Fundamentally, an RF device manages a high frequency signal, which is a frequency signal that is apt to radiate as external electromagnetic waves, so that some energy radiates from a line in electromagnetic waves or magnetic waves. That is, an energy signal flows into the lines of the electromagnetic/ magnetic waves directly or indirectly, which is called the coupling. As the frequency becomes higher, the electromagnetic wave energy from the line increases, thereby increasing the coupling. A "coupler" refers to a circuit structure using the coupling and is provided generally in RF devices.

In this sense, a power divider is a coupler that divides one electric power signal into at least two electric power signals. Here, the coupling usually means that the energy is interchanged between disconnected lines, and the coupler means that the signal is interchanged in state that the lines are not connected in DC. In general, the coupling ratio of a coupler relates to a length of parallel lines and an interval between the parallel lines. The length of the parallel lines is usually $\lambda/4$ (quarter wavelength), and the interval between the parallel lines is controlled to form a coupler of 3 dB, 6 dB, 10 dB, 20 dB, etc.

For example, if the electric power is divided in half, the coupler is a 3 dB divider (3 dB is twice, and −3 dB is half, herein, '−' is not shown). If the electric power is divided in twenty to one, the coupler is a sampler obtaining a signal.

A coupler has the advantage of receiving the signal without any reflection when the VSWR of input and output terminals is "1" in theory. Thus, the coupler can be used as input and output matching means for an active circuit. At this time, the circuit is divided into two, thereby increasing the size of the circuit. Also, the divided circuits are conversely connected, so that the coupler is served as a connector. Generally, the coupler functions as an input terminal, an output terminal, a coupling port and an isolation port.

The size of the coupler relates to an extracted signal value, especially, to a certain frequency wavelength (usually $4/1\lambda$), thereby narrowing the bandwidth of the signal. The above problem may occur in the Wilkilson power divider.

A related art coupler is used to divide and extract a signal power, which can be variously applicable. However, a related art Wilkilson power divider has the following problems.

First, in the related art Wilkilson power divider, each electrode of a capacitor on the substrate of the divider is formed of a polysilicon layer. Accordingly, as a voltage difference between the electrodes of the capacitor increases, a depletion generated between the electrodes is deepened, thereby deteriorating a voltage coefficient characteristic of the capacitor in the power divider.

Furthermore, in the related art Wilkilson power divider, if a metal capacitor detects an output signal by a contact area formed at a drain region of the substrate for connecting with an upper metal line, an AC signal is detected. However, with the related art Wilkilson power divider, it is hard to detect an original signal such as AC+DC signal.

SUMMARY OF THE INVENTION

Accordingly, the present invention is directed to a power divider that substantially obviates one or more problems due to limitations and disadvantages of the related art.

An object of the present invention is to provide a power divider having a metal capacitor formed on a substrate to detect and to divide a frequency signal, in which the metal capacitor can be used to additionally amplify a signal even though an AC signal is increased or decreased by little because an original signal (AC+DC) flows through a contact area at a drain region.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a power divider having a capacitor formed on a substrate to detect AC power signal and divide the AC power signal, includes a first capacitor sequentially including a first electrode, a dielectric layer, a capping layer and a second electrode at a drain region of a first transistor formed at a predetermined portion of the substrate; a second capacitor sequentially including a first electrode, a dielectric layer, a capping layer and a second electrode at a drain region of a second transistor formed at a portion departed from the predetermined portion of the substrate; a first metal line connected to the second electrode of the first capacitor to transmit an AC power signal detected from the first capacitor; a second metal line connected to the second electrode of the second capacitor to transmit an AC power signal detected from the second capacitor; a poly resistor connected to a contact area of the first capacitor and the first metal line, and connected to a contact area of the second capacitor and the second metal line; and a third metal line connected to the first and second metal lines to halve AC power signal flown in the first and second metal lines in common, and to transmit the halved signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
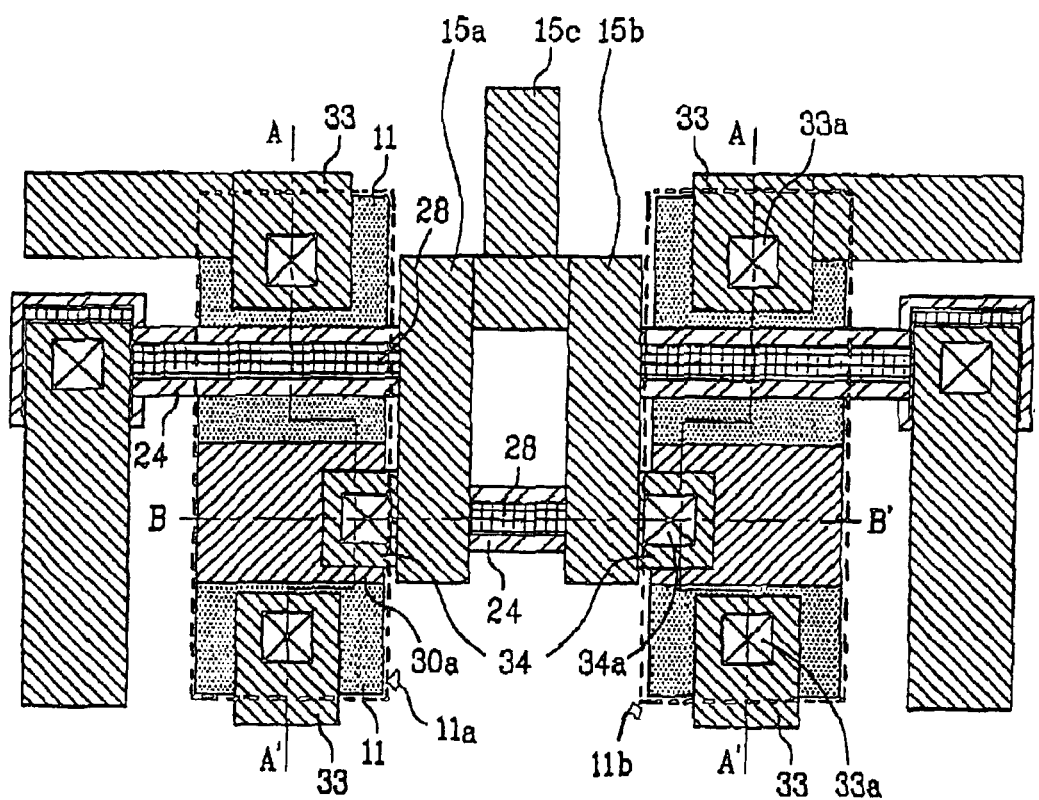
FIG. 1 is a layout illustrating a power divider and other devices according to an embodiment of the present invention.

FIG. 1 is a layout of a power divider and other devices according to an embodiment of the present invention. Referring to FIG. 1, line A–A' crosses a transistor and a metal capacitor formed on an active region 11 of a substrate, and line B–B' crosses a poly resistor 12 between the metal capacitor and a metal line.

The metal capacitor used in forming the power divider according to the present invention will be described in detail.

FIG. 2A to FIG. 2E are cross-sectional views illustrating manufacturing process steps of the metal capacitor taken along line A–A' of FIG. 1.

Figure 2A:
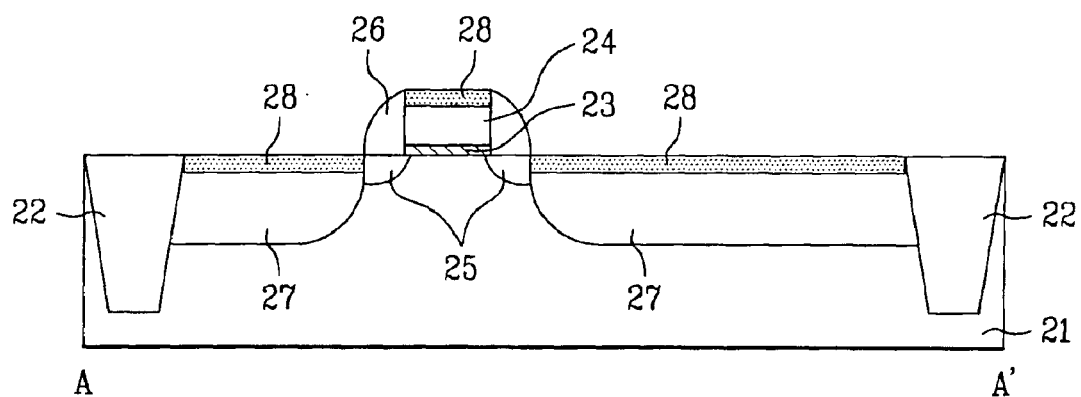
FIG. 2A to FIG. 2E are cross-sectional views illustrating manufacturing process steps of a metal capacitor taken along line A–A' of FIG. 1 according to an embodiment of the present invention.

As shown in FIGS. 1 and 2A, first, a transistor is formed on an active region 11 of a substrate 21. More specifically, a field oxide layer 22 is formed on the substrate 21 by an STI process or the like, and then an implant process is performed to form a well region. An oxide layer and a polysilicon layer are sequentially formed on the entire surface of the substrate 21, and then selectively removed to form a gate oxide layer 23 and a gate electrode 24. Then, lightly doped ions are injected into both sides of the gate electrode 24 to form lightly doped drain (LDD) regions 25.

Subsequently, gate sidewall spacers 26 are formed at both sides of the gate electrode 24, and then ions are injected by using the gate electrode 24 and the gate sidewall spacers 26 as masks, thereby forming source and drain regions 27.

Next, metal ions are deposited on the upper parts of the exposed source/drain regions 27 and the gate electrode 24 and then an annealing process is performed to form a salicide layer 28. The salicide layer 28 functions as one of two electrodes for a capacitor to be completed subsequently.

Figure 2B:
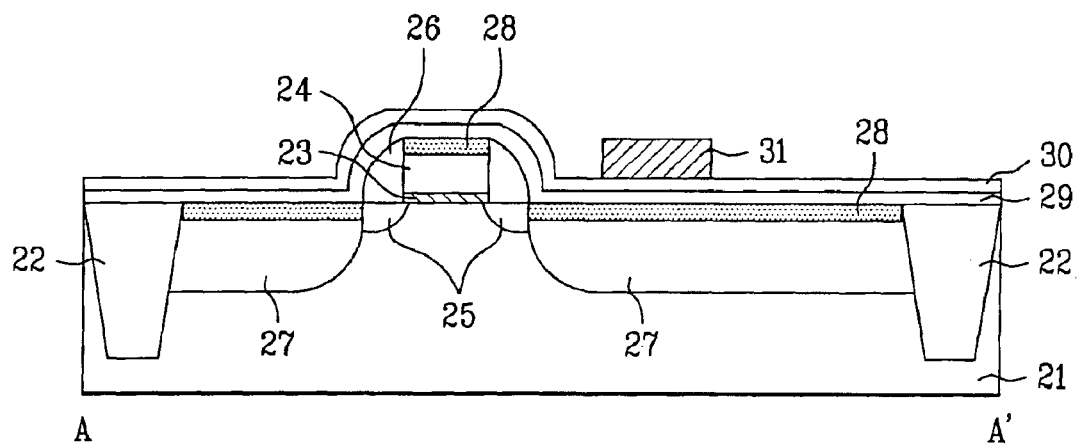

As shown in FIG. 2B, a dielectric layer 29 and a capping layer 30 are sequentially formed on the entire surface of the substrate 21 including the transistor. Here, the dielectric layer 29 is formed of a material used for a dielectric layer of a general capacitor, such as plasma enhanced tetra ethyl ortho silicate (PE TEOS) or plasma enhanced SiN.

The capping layer 30 is deposited on the dielectric layer 29 to control the capacitance of the capacitor by varying the size of an area of the deposited capping layer 30. Even though the capacitance of the capacitor can be controlled by a thinness or thickness of the deposited capping layer 30, the capacitance of the capacitor is usually controlled by the area of the capping layer 30 (i.e., an upper substrate area of the capping layer 30) by determining a dielectric material according to the range of the desired capacitance value to improve the intensity of the device. Here, the capping layer 30 is formed of TiN, but any other suitable material may be used.

Subsequently, a photoresist pattern 31 is coated at a predetermined region where the capacitor is to be formed on the source and drain regions 27. Here, the size of the surface area of the capping layer 30 on which the photoresist pattern 31 is coated is directly related to the capacitance value of the capacitor to be completed. Accordingly, the photoresist pattern 31 is deposited to be of a predetermined area size corresponding to the desired capacitance of the capacitor.

Figure 2C:
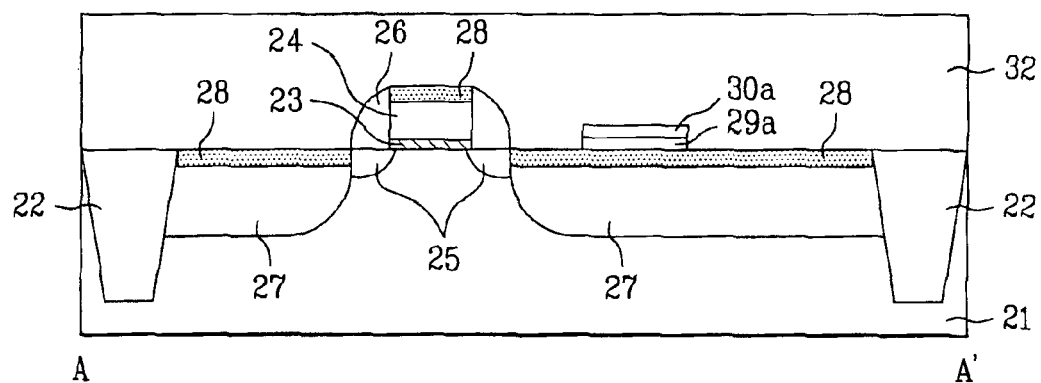

As shown in FIG. 2C, the capping layer 30 and the dielectric layer 29 are selectively removed from the regions of the substrate where the photoresist pattern 31 is not formed by using the photoresist pattern 31 as a mask. This forms a capping layer pattern 30a and a dielectric layer pattern 29a on the substrate 21.

Subsequently, an insulating layer 32 is sufficiently deposited on the entire surface of the substrate by a chemical vapor deposition (CVD) process or other suitable process, thereby planarizing the insulating layer 32. Here, the insulating layer 32 is formed of an oxide layer.

Figure 2D:
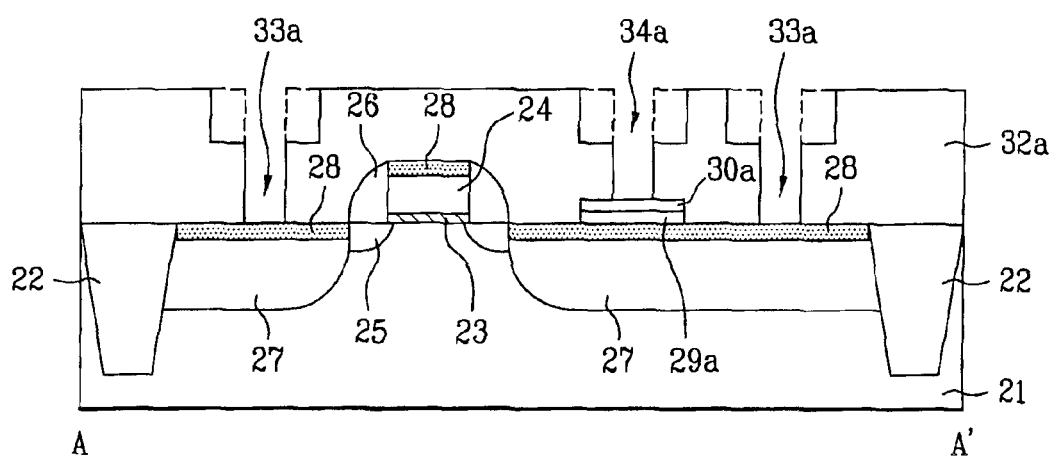

As shown in FIG. 2D, the insulating layer 32 is selectively removed to expose predetermined portions of the source and drain regions 27, thereby forming exposed contact areas 33a for electrically connecting the source and drain regions 27 to an upper metal line. At this time, the insulating layer 32 is further selectively removed to define a hole 34a that exposes a predetermined portion of the capping layer pattern 30a.

In the first embodiment of the present invention, the exposed contact area(s) 33a are formed in a dual damascene process buried by copper, as indicated by a solid line). Meanwhile, in the second embodiment of the present invention, the exposed contact area(s) 33a formed in the process of filling a hole with a plug material such as tungsten, as indicated by a dotted line.

Figure 2E:
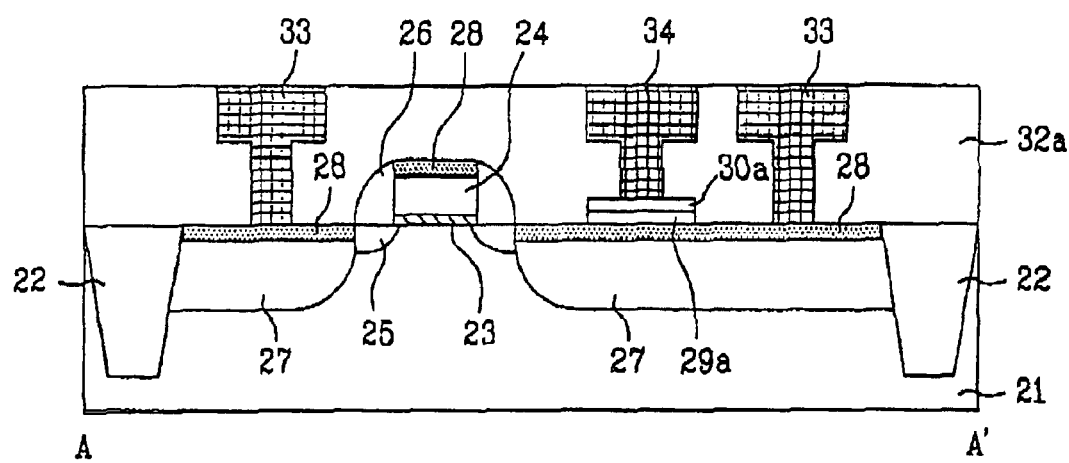

As shown in FIG. 2E, the exposed contact areas 33a and hole 34a are filled with a metal to form plugs 33 of the contact areas and a second electrode 34 of the capacitor, respectively. That is, the salicide layer 28 functions as the first electrode of the capacitor, the second electrode 34 is the second electrode of the capacitor, and the dielectric layer 29a functions as a dielectric sandwiched between the first and second electrodes. In this manner, the salicide layer 28, the dielectric layer 29a, the capping layer 30a and the second electrode 34 define a capacitor.

At this time, in the first embodiment where the contact areas are buried as discussed above in connection with FIG. 2D, the plug and metal line materials are equally formed of copper, and are simultaneously buried. In the second embodiment where the hole 34a is filled with a plug material such as tungsten as discussed above in connection with FIG. 2D, a glue layer is deposited and the plug material is deposited. Then, the plug material is planarized at a surface of the oxide layer as an end point, and a metal line (e.g., aluminum) is deposited.

The contact areas 33 are buried at the same height as the second electrode 34 of the capacitor even though the height of a lower layer where the contact areas 33 are buried is different from the height of a lower layer where the second electrode 34 of the capacitor is formed.

Figure 3:
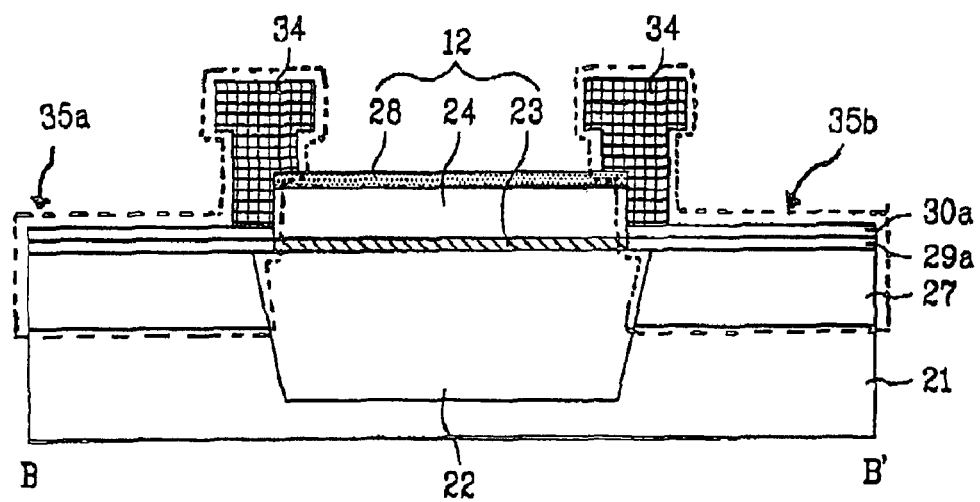
FIG. 3 is a cross-sectional view illustrating manufacturing process steps of a poly resistor taken along line B–B' of FIG. 1 according to an embodiment of the present invention.

FIG. 3 is a cross-sectional view illustrating manufacturing process steps of a poly resistor 12 taken along line B–B' of FIG. 1 according to an embodiment of the present invention.

As shown in FIG. 3, the substrate 21 is divided into an active region 11 and a field region by the field oxide layer 22. As the polysilicon layer is deposited and patterned on the substrate to form the gate electrode 24, the polysilicon layer forms the poly resistor 12 between the two contact areas 33. That is, the polysilicon layer functions as a resistor between two contact areas. At this time, an upper part of the polysilicon layer is salicided during saliciding of each electrode (source, drain, gate) of the transistor, or is non-salicided by forming a mask on the upper part of the polysilicon layer. The poly resistor is provided to consume a reflected signal of an odd mode.

Figure 4:
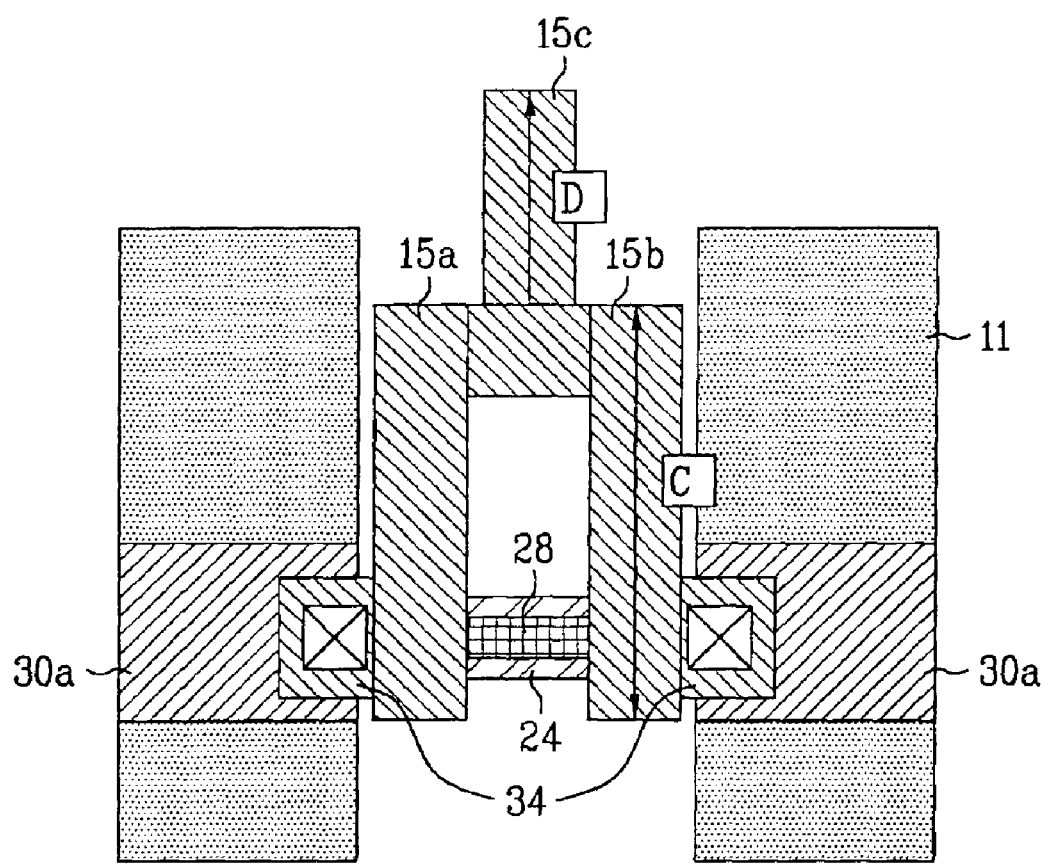
FIG. 4 is a layout of the power divider shown in FIG. 1 according to the embodiment of the present invention.

FIG. 4 is a layout of the power divider shown in FIG. 1 according to the embodiment of the present invention. As shown in FIG. 4, the power divider having a capacitor for detecting and dividing an AC power signal according to the present invention includes a first capacitor 35a, a second capacitor 35b, a first metal line 15a, a second metal line 15b, a poly resistor 12 and a third metal line 15c, all operatively coupled.

The first capacitor 35a sequentially includes a first electrode, a dielectric layer 29a, capping layer 30a and a second electrode 34 at a drain region 27 of a first transistor 11a formed at a predetermined portion of a substrate 21. The second capacitor 35b sequentially includes a first electrode, a dielectric layer 29a, a capping layer 30a and a second electrode 34 at the drain region 27 of a second transistor 11b formed at the substrate departed from the predetermined portion of the first capacitor 35a. The first metal line 15a is connected to the second electrode 34 of the first capacitor 35a to transmit the AC power signal detected from the first capacitor 35a, and the second metal line 15b is connected to the second electrode 34 of the second capacitor 35b to transmit the AC power signal detected from the second capacitor 35b. The poly resistor 12 is connected to the contact area of the first capacitor 35a and the first metal line 15a, and to the contact area of the second capacitor 35b and the second metal line 15b. The third metal line 15c is connected to the first and second metal lines 15a, 15b to halve the AC power signal flowing through the first and second metal lines 15a, 15b in common, and to transfer the AC power signal.

The power divider of the present invention is preferable of a Wilkilson power divider type, in which a capping impedance of the capacitor is matched to the characteristic impedance of the metal line to consume a reflected signal of an odd mode at the poly resistor, and the signal of an even mode transmits the AC power signal divided in half. When the poly resistor is 2Z, the characteristic impedance of C line is $\sqrt{2}*Z$ and the characteristic impedance of D line is Z.

As shown in FIG. 3, the poly resistor formed with the polysilicon layer at the field region can be used not only in the power divider of the present invention, but also in devices using any RF device as a resistor for isolation.

In the power divider of the present invention, the RF signal amplified by the transistor is detected by two metal capacitors each composed of metal/capping layer/salicide/$N^+$ regions. Then, the power of these equal elements having two signals can be divided in half.

Particularly, if the power divider of the present invention is a Wilkinson power divider, the power of equal elements having two signals applied from each metal capacitor through two metal capacitors is divided in half and is transmitted.

Further, in the power divider of the present invention, the AC signal is detected during a back-end process, thereby processing a frequency signal. Moreover, the metal (electrode) capacitor is formed of polysilicon, so that a depletion amount less than the capacitor forming the electrode is generated. Also, the poly resistor between the metal capacitors is used as a resistance to consume a reflected power of the power divider.

The metal capacitor of the power divider according to the present invention couples only the AC signal of direct current and alternating current signals from the drain region, thereby halving the equal power elements (3 dB) of the AC signal generated from the two transistors without influencing the original signal and without requiring additional circuit structure.

The power divider according to the present invention has at least the following advantages.

First, unlike the related art poly capacitor of the power divider, the metal capacitor of the power divider according to the present invention does not generate depletion, so that it is possible to prevent a voltage coefficient characteristic of the capacitor from being deteriorated with an increase of voltage between capacitor electrodes.

Next, in the power divider of the present invention, the frequency processing can be performed by the AC signal detected in the back end process.

Finally, the metal capacitor of the power divider according to the present invention couples only the AC signal, thereby dividing the electric power without influencing the original signal and other circuit structures.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. A power divider comprising:

a first capacitor including a first electrode, a dielectric layer, a capping layer and a second electrode, wherein the first electrode of the first capacitor is formed at a source/drain region of a first transistor in a first portion of a substrate;

a second capacitor including a first electrode, a dielectric layer, a capping layer and a second electrode, wherein the first electrode of the second capacitor is formed at a source/drain region of a second transistor formed at a second portion apart from the first portion of the substrate;

a first metal line connected to the second electrode of the first capacitor to transmit an AC power signal detected from the first capacitor;

a second metal line connected to the second electrode of the second capacitor to transmit an AC power signal detected from the second capacitor;

a poly resistor connected to a contact area of the first capacitor and the first metal line, and to a contact area of the second capacitor and the second metal line; and a third metal line connected to the first and second metal lines to divide an AC power signal flown through the first and second metal lines in common, and to transmit the divided power signal.

2. The power divider as claimed in claim 1, wherein the first and second capacitors is formed by the steps of:

defining the first electrodes at a predetermined portion of the first region of the first or second transistor, sequentially depositing the dielectric layer and the capping layer on an entire surface of the substrate including the first or second transistor, depositing a photoresist pattern on an upper part of the capping layer deposited on the substrate defining the first electrodes, removing the capping layer and the dielectric layer according to the photoresist pattern, depositing an insulating layer to cover the capping layer and the first or second transistor, forming a contact area exposing the upper part of the capping layer by selectively removing the insulating layer, and forming the second electrodes by burying said contact area with metal and by planarizing said contact area.

3. The power divider as claimed in claim 1, wherein upper parts of source/drain regions and a gate electrode of the first or second transistor are salicided.

4. The power divider as claimed in claim 2, wherein a process forming the second electrodes by burying and planarizing the contact area is performed in the same step with a process burying the contact area between source/drain of the first and second transistors on the substrate and an upper metal line.

5. The power divider as claimed in claim 4, wherein the processes of forming the second electrodes and burying the contact area between the source/drain of the first and second transistors on the substrate and the upper metal line include the steps of:

depositing a glue layer, depositing a metal plug, planarizing the metal plug, and depositing a metal line.

6. The power divider as claimed in claim 4, wherein the process of forming the second electrodes and burying the contact area between the source/drain of the first and second transistors on the substrate and the upper metal line include the steps of:

forming a trench and the contact area in dual daniascene type, depositing a metal layer within the trench and the contact area, and forming a metal line by planarizing the metal layer.

7. The power divider as claimed in claim 1, wherein at least one of the dielectric layers of the first and second capacitors is formed of PECVD $SiO_2$ or PECVD SiN.

8. The power divider as claimed in claim 1, wherein at least one of the capping layers of the first and second capacitors is formed of TiN.

9. The power divider as claimed in claim 1, wherein each capacitance of the first and second capacitors is determined according to the size of an area of the corresponding capping layer.

10. The power divider as claimed in claim 1, wherein the substrate is divided into active and field regions by a field oxide layer, and then a poly silicon layer is formed on the field oxide layer to form the poly resistor.

11. The power divider as claimed in claim 10, wherein the poly resistor is salicided.

12. The power divider as claimed in claim 1, wherein at least one of the first region of the first transistor and the first region of the second transistor is a drain region.

* * * * *